(12) United States Patent
Sato

(10) Patent No.: US 6,990,262 B2
(45) Date of Patent: Jan. 24, 2006

(54) OPTICAL MODULE

(75) Inventor: Masahiro Sato, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 142 days.

(21) Appl. No.: 10/667,968

(22) Filed: Sep. 23, 2003

(65) Prior Publication Data

US 2004/0101260 A1   May 27, 2004

(30) Foreign Application Priority Data

Sep. 24, 2002   (JP) ............................. 2002-277853

(51) Int. Cl.
*G02B 6/12* (2006.01)

(52) U.S. Cl. ..................... 385/14; 385/15; 385/94; 372/50; 396/47.51

(58) Field of Classification Search .................. 385/14, 385/15, 18, 27, 39, 40, 83, 92, 94; 372/50; 396/47.51
See application file for complete search history.

(56) References Cited

U.S. PATENT DOCUMENTS

| | | | |
|---|---|---|---|
| 6,190,056 B1 * | 2/2001 | Kwon et al. | 385/91 |
| 6,374,021 B1 * | 4/2002 | Nakanishi et al. | 385/49 |
| 6,575,641 B2 * | 6/2003 | Yamabayashi et al. | 385/88 |
| 2003/0002820 A1 * | 1/2003 | Nakanishi et al. | 385/88 |
| 2003/0151121 A1 * | 8/2003 | Kuhara et al. | 257/666 |
| 2003/0169981 A1 * | 9/2003 | Nakanishi et al. | 385/92 |

* cited by examiner

*Primary Examiner*—Kaveh Kianni
(74) *Attorney, Agent, or Firm*—McDermott Will & Emery LLP

(57) ABSTRACT

This invention provides an optical module, in which a wiring inductance between a laser diode and a circuit for driving the laser diode may be reduced, thereby enhancing a high frequency performance. The optical module of the invention has a bench on which the laser diode and the circuit are arranged. A level of a first region of the bench where the laser diode is mounted is higher than that of a second region thereof where the circuit is mounted. A photodiode for monitoring the light emitted from the laser diode is aligned and mounted on the circuit through the carrier so that the photodiode optically couples to the laser diode.

13 Claims, 15 Drawing Sheets

OPTICAL MODULE

BACKGROUND OF THE INVENTION

1. Field of the Invention

This invention relates to an optical module, especially light-emitting optical module.

2. Related Prior Art

Recent optical communication system requests faster transmission-speed over 10 gigabit per second. An optical module, especially optical transmitting module applied in such high-speed optical communication system is necessary to output a high-speed optical signal without distortion.

Conventional optical module comprises a laser diode, a driver for driving the laser diode and a photodiode for monitoring an optical output of the laser diode. In such conventional optical module, the photodiode is arranged between the laser diode and the driver for effectively monitoring the optical output of the laser diode and the driver is placed next to the photodiode.

In order to transmit the signal with a high frequency and to driver the laser diode by such high frequency signal, an interval between the laser diode and the driver must be shortened to decrease the inductance due to the wiring therebetween. In the conventional optical module, since the photodiode is arranged between the laser diode and the driver, the interval cannot shorten.

SUMMARY OF THE INVENTION

According to one aspect of the present invention, an optical module comprises a light-emitting semiconductor device such as a laser diode, a driver for driving the laser diode, a light-receiving semiconductor device such as a photodiode and a bench for mounting the laser diode and the driver. The bench includes a first region for mounting the driver and a second region for mounting the laser diode. One feature of the present invention is that a level of the first region is lower than a level of the second region. The driver includes a primary surface where electrodes and electrical devices are formed thereon and a secondary surface. When the driver is mounted on the first region, a level of the secondary surface is lower than the level of the second region of the bench. Consequently, a space is formed above the secondary surface of the driver through which the light emitted from the laser diode reaches the photodiode.

The driver has bump electrodes on the primary surface thereof and is mounted by the flip-chip technique on the first region of the bench so that the primary surface faces to the first region.

According to one feature of the present invention, the photodiode diode is mounted on the secondary surface of the driver through a chip carrier on which the photodiode is mounted. The photodiode can receive the light emitted from the laser diode and passes through the space above the secondary surface of the driver because the photodiode is mounted on the chip carrier and the level of the secondary surface of the driver is lower than the level of the second region of the bench.

According to another feature of the present invention, the module further comprises an optical device having a light-reflecting surface on the secondary surface of the driver. The photodiode arranged out of the driver may optically couple to the laser diode through the light-reflecting surface of the optical device. Namely, the light emitted from the laser diode passes the space above the secondary surface of the driver, is reflected by the light-reflecting surface of the optical device and finally enters into the photodiode. Since the photodiode is arranged out of the driver, the driver may be placed adjacent to the laser diode and the distance between the driver and the laser diode can shorten.

Still another feature of the present invention, the photodiode includes a light-incident surface and a light-sensitive surface. The light-incident surface faces to the laser diode and the light-sensitive surface crosses the light-incident surface. The light-emitted from the laser diode enters into the light-incident surface and a portion of the entered light is sensed at the light-sensitive surface thereof. The photodiode may be mounted in a configuration that the light-sensitive surface faces to the secondary surface of the driver or the light-sensitive surface looks towards a direction opposing to the secondary surface of the driver. In this arrangement of the driver and the photodiode, the driver may be mounted next to the laser diode, thereby the distance therebetween can be shortened.

The optical module of the present invention may further comprise an optical fiber for receiving the light emitted from the laser diode. The bench further includes a third and a fourth regions. The regions from the first to the fourth are arranged along a predetermined direction and the optical fiber is fixed in a first groove formed in the third region and parallel to the predetermined direction.

The bench may further comprise a second groove partitioning the second region and the third region. A tip of the optical fiber fixed into the first groove reaches a side of the second groove so that the optical fiber optically couples to the laser diode. A resin transparent to the light emitted from the laser diode may encapsulate the laser diode, the photodiode and the tip of the optical fiber. Therefore, the reliability of the optical module can be enhanced.

DETAILED DESCRIPTION OF PREFERRED EMBODIMENTS

Next, a preferred embodiment of an optical module according to the present invention will be described as referring to accompanied drawings. Elements identical to each other will be referred to with numerals identical to each other without overlapping explanations. In the description, the front side is the direction to which the signal light is emitted.

(First Embodiment)

Figure 1:
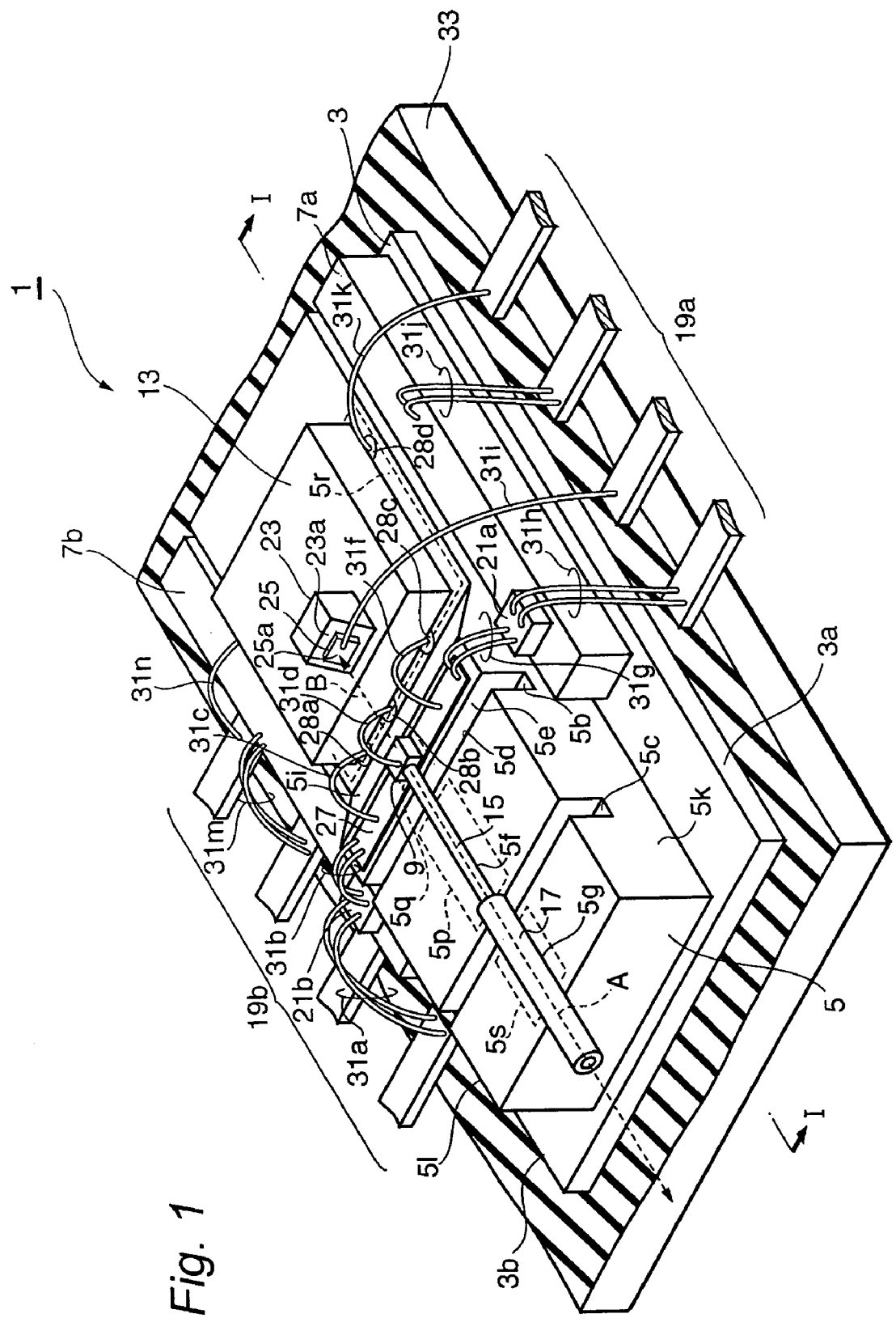
FIG. 1 is a perspective view showing the optical module according to the first embodiment.
Figure 2:
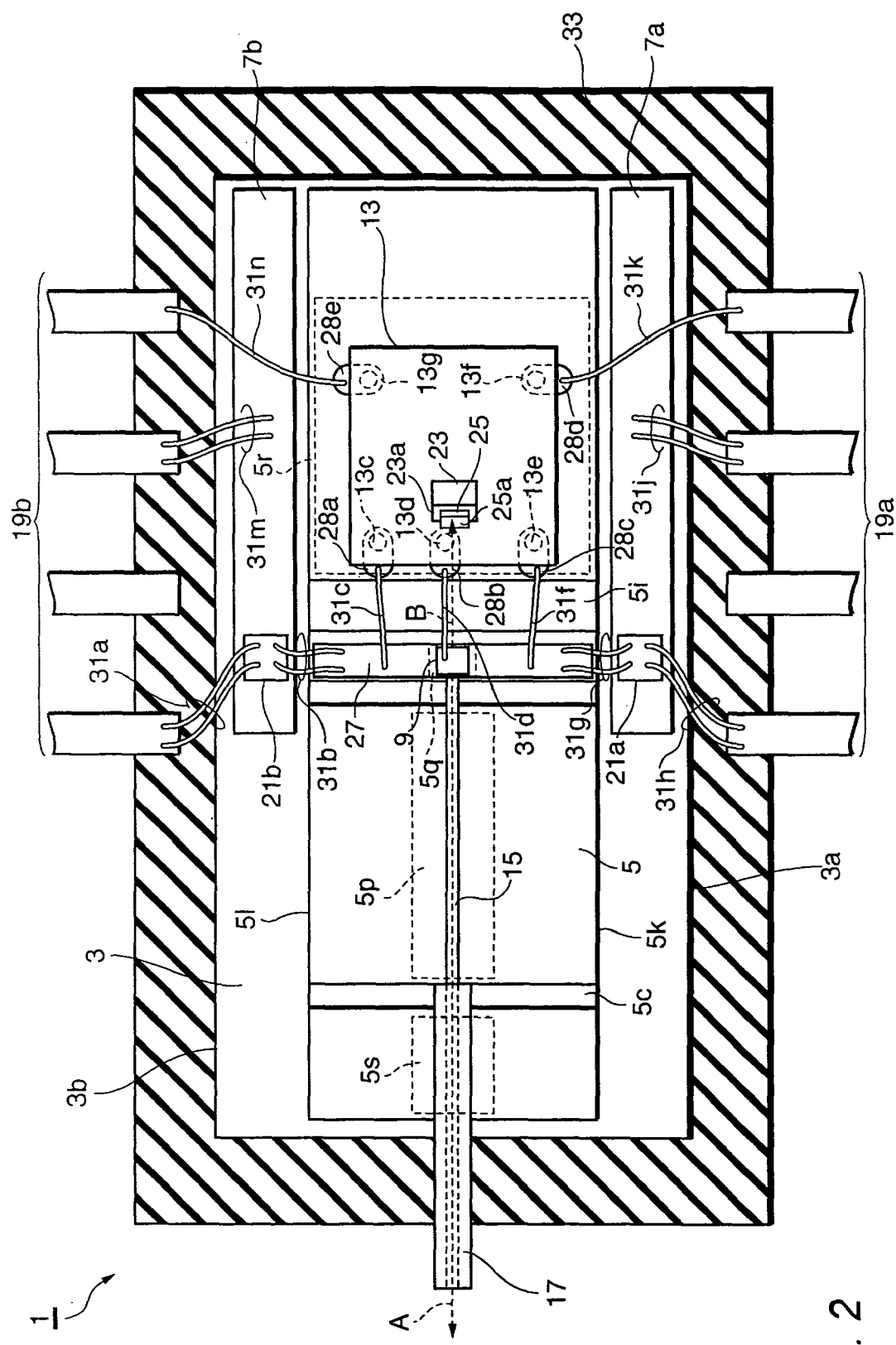
FIG. 2 is a plan view of the optical module shown in FIG. 1.
Figure 3:
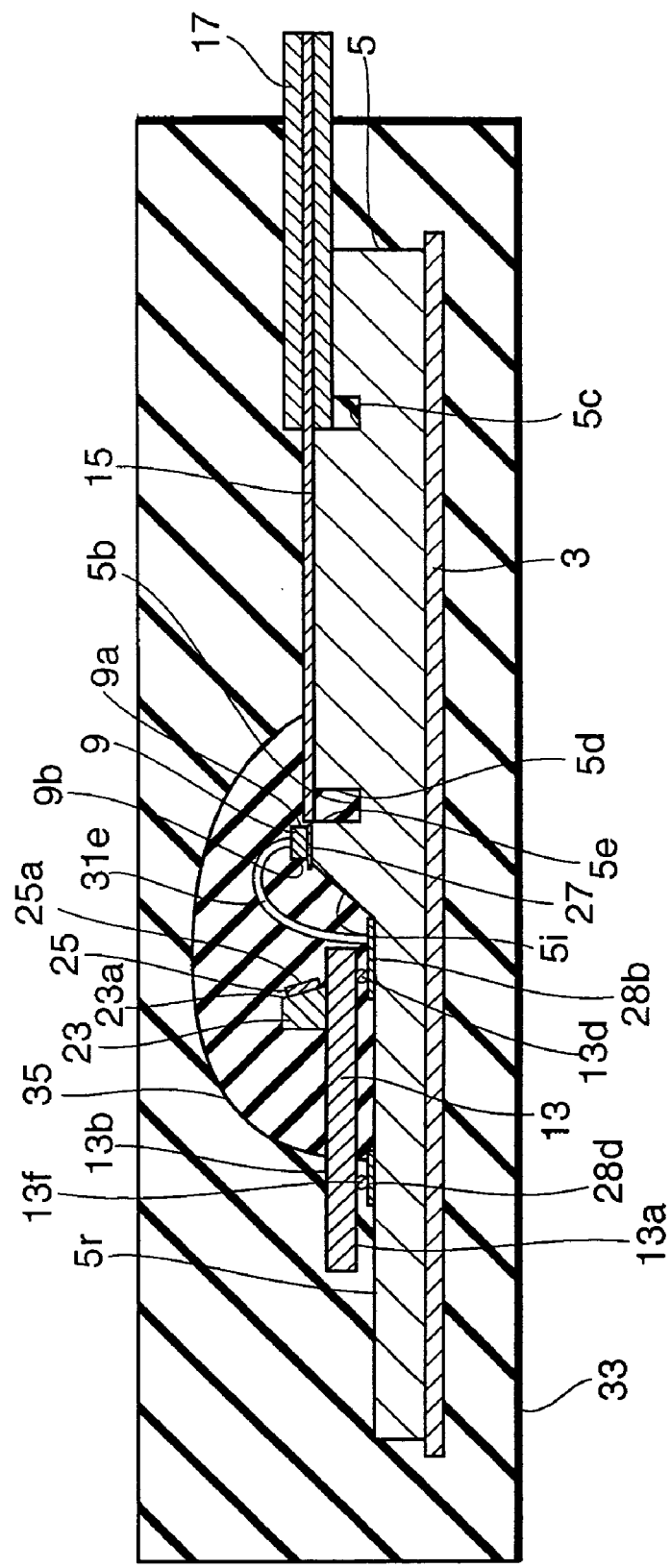
FIG. 3 is a cross sectional view taken along I—I in FIG. 1.

FIG. 1 is a perspective view of an optical module according to the first embodiment, FIG. 2 is a plan view of the optical module and FIG. 3 is a cross-sectional view taken along I—I in FIG. 1.

The optical module 11 comprises a substrate 3, a bench 5, a laser diode 9, a driver 13, an optical fiber 15, a ferrule 17, a photodiode 25, a chip carrier 23 for supporting the photodiode, and a plurality of lead terminals 19a and 19b. The laser diode emits signal light and the photodiode receives a portion of the signal light.

The bench 5 is mounted on the substrate 3. A primary surface of the bench 5 has a first region 5r, a second region 5q, a third region 5p and a fourth region 5s, these regions are arranged in this order along a predetermined axis. The level of the first region 5r is lower than that of the second region 5q and the difference of the level will be described later. Between the first region 5r and the second region 5q, a slope 5i may be formed to compensate the difference of the levels.

A groove 5b is formed between the second region 5q and the third region 5p so as to cross the predetermined axis is formed and another groove 5c is formed between the third region 5p and the fourth region 5s so as to cross the predetermined axis. A groove 5f for fixing the optical fiber 15 is provided in the third region 5p, which extends from the groove 5b to another groove 5c. A groove 5g for fixing the ferrule 17, which is protecting a tip of the optical fiber 15, is provided on the fourth region 5s that extends from another groove 5c to an edge of the bench 5. The groove 5g for fixing the ferrule is deeper than the groove 5f for the optical fiber 15.

A conductive wiring 27 is provided on the second region, which extends along the direction across the predetermined axis. A laser diode 9 is mounted on the conductive wiring 27. The laser diode has a light-emitting surface 9a and a light-reflecting surface 9b that faces to the first region 5r of the bench 5. As shown in FIG. 2, the laser diode emits the signal light "A" from the light-emitting surface 9a and also emits the monitored-light "B" from the light-reflecting surface 9b.

A groove 5b is provided between the second region 5q and the third region 5p, while another groove 5c is provided between the third region 5p and the fourth region 5s, each extending along a direction crossing to the predetermined axis. The optical fiber 15 is fixed in the groove 5f on the third region 5p, thereby the optical fiber 15 is aligned to the direction crossing to the predetermined axis. On the other hand, a tip of the optical fiber 15 abuts to one of side wall of the groove 5b and facing to the light-emitting surface 9a of the laser diode 9, thereby the position of the optical fiber 15 is determined along the direction parallel to the predetermined axis. The ferrule 17 covers a 6 portion of the optical fiber 15 and the ferrule is arranged in the groove 5g. Thus, the signal light "A" emitted from the light-emitting surface 9a of the laser diode 9 is guided to the outside of the module through the optical fiber 15. The bench is made of an insulator or silicon. In the case that the bench is made of silicon, the grooves in the third and fourth regions and the step between the first and second regions are made by etching.

The lead terminals 19a and 19b are arranged along a pair of side edges 3a and 3b of substrate 3, they extending along the predetermined axis.

The driver 13 that drives the laser diode 9 has a primary surface 13a and another surface 13b opposing to the primary surface 13a. On the primary surface 13a, a plurality of bump electrodes 13c to 13g is formed. The driver 13 is mounted by a flip-chip technique on the first region 5r of the bench 5 so as to face the primary surface to the first region 5r. The bump electrodes 13f and 13g of the driver 13 receive a transmitting-signal that is converted to the signal light "A" and transmitted to the outside of the module. The bump electrode 13f is connected to a conductive-wiring 28d formed on the first region 5r, which is connected to the lead terminal 19a by a bonding-wire 31k. Also, the bump electrode 13g is connected to the lead terminal 19b through the conductive wiring 28e formed on the first region 5r.

The driver 13 has another bump electrode 13d to provide a signal for driving the laser diode 9. The bump electrode 13d is connected to a conductive-wiring 28b by the flip-chip technique, and the conductive-wiring 28b is electrically connected to the laser diode 9 through the boding-wire 31d and the conducive wiring 27 on the second region 5q of the bench 5.

Another bump electrodes 13c and 13e of the driver 13 for providing a power thereto are connected to wiring patterns 28a and 28c on the bench 5, respectively. These wiring patterns 28a and 28c are connected to the wiring 27 on the second region 5q by bonding wires 31c and 31f.

The chip carrier 23 is mounted on the surface 13b of the driver 13. The chip carrier 23 has a surface 23a for mounting the photodiode 25 thereon, which slightly inclines to the predetermined axis by about 8° so that the light reflected by the surface 25a of the photodiode 25 does not return to the laser diode 9. The chip carrier 13 with the photodiode thereon is aligned so that the surface 25a of the photodiode 25 receives the monitored-light "B", whereby the surface 25a is optically coupled to the light-reflecting surface 9b of the laser diode 9.

The optical module may further comprise auxiliary members 7a, 7b and die-capacitors 21a, 21b, each provided on the auxiliary members 7a, 7b. The auxiliary members 7a, 7b are made of metal and arranged along respective sides 5k, 5l of the bench 5b on the substrate 3. The auxiliary member 7a is connected to the lead terminal 19a by the bonding wire 31j, while the auxiliary member 7b is connected to the lead terminal 19b by the bonding wire 31m.

Die-capacitors 21a, 21b are provided to stabilize the power voltage supplied to the laser diode 9 and the driver 13. The die-capacitor 21a is mounted on the auxiliary member 7a and an electrode on the surface thereof is connected to the conductive wiring 27 through the bonding wire 31g and to the lead terminal 19a through the wire 31h. The other die-capacitor 21b is mounted on the another auxiliary member 7b and the surface thereof is connected to the conductive wiring 27 through the wire 31b and to the lead terminal 19b through the wire 31a.

The optical module 1 of the present embodiment may include a sealing resin 33 and a transparent resin 35, as shown in FIG. 3. The transparent resin 33 encapsulates the laser diode 9 and its peripheral devices, such as the optical fiber 15 and the photodiode 25, with keeping the optical coupling between the laser diode 9 and the optical fiber 15 and that between the laser diode 9 and the photodiode 25.

The resin 33 molds the optical devices encapsulated by the transparent resin 35, the optical fiber 15, the ferrule 17 and the lead terminals 19a, 19b so that a tip of the optical fiber 15, the ferrule 17 and the lead terminals are exposed to the outside.

Figure 4A:
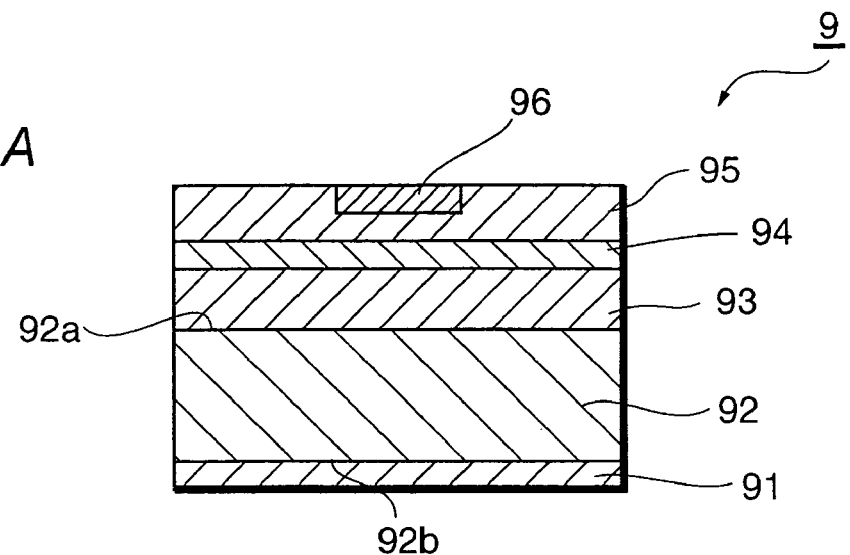
FIG. 4A is a cross sectional view showing a configuration of the laser diode and FIG. 4B is a magnified view showing around the laser diode in FIG. 2.
Figure 4B:
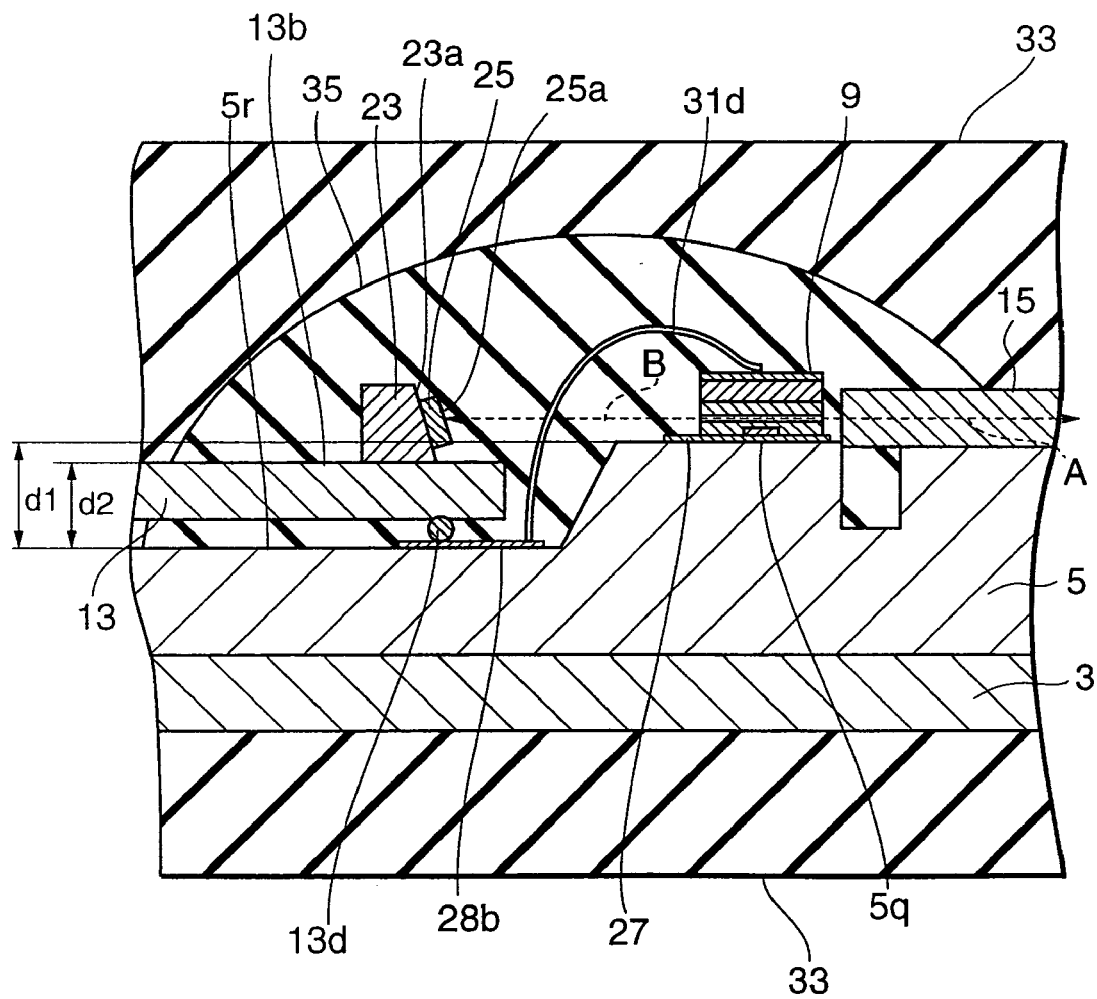

FIG. 4A is a cross sectional view showing a configuration of the laser diode 9 and FIG. 4B is a magnified sectional view shown in FIG. 2. The laser diode 9 has a cathode electrode 91, a semiconductor substrate with n-conduction type 92, n-cladding layer 93, an active layer 94, a p-cladding layer 95 and an anode electrode 96. The active layer 94 sandwiched by the n-cladding layer 93 and the p-cladding layer 95 generates a coherent laser light.

As shown in FIG. 4B, the laser diode is mounted on the bench 5 so that the anode electrode 96 thereof faces to the conductive wiring 27 on the bench 5. In FIG. 4B, the laser diode 9 is shown upside down compared to that shown in FIG. 4A. The cathode electrode 91 thereof is electrically connected to the driver 13 through the bonding wire 31d, the conductive wiring 28b and the bump electrode 13d of the driver. The anode electrode 96 of the laser diode 9 is connected to the conductive wiring 27 by a conductive adhesive, such as solder.

As shown in FIG. 4B, the level of the first region 5r is formed so that the level of the surface 13b of the driver 13 is lower than that of the second region 5q. In the present embodiment, the level difference d1 between the first region 5r and the second region 5q is greater than that d2 between the surface 13b of the driver 13 and the first region 5r. The level of the surface 13b of the driver 13 is lower than the second region 5q by d1–d2, whereby the photodiode effectively receives the monitored light "B" emitted from the reflecting surface of the laser diode 9.

Figure 5:
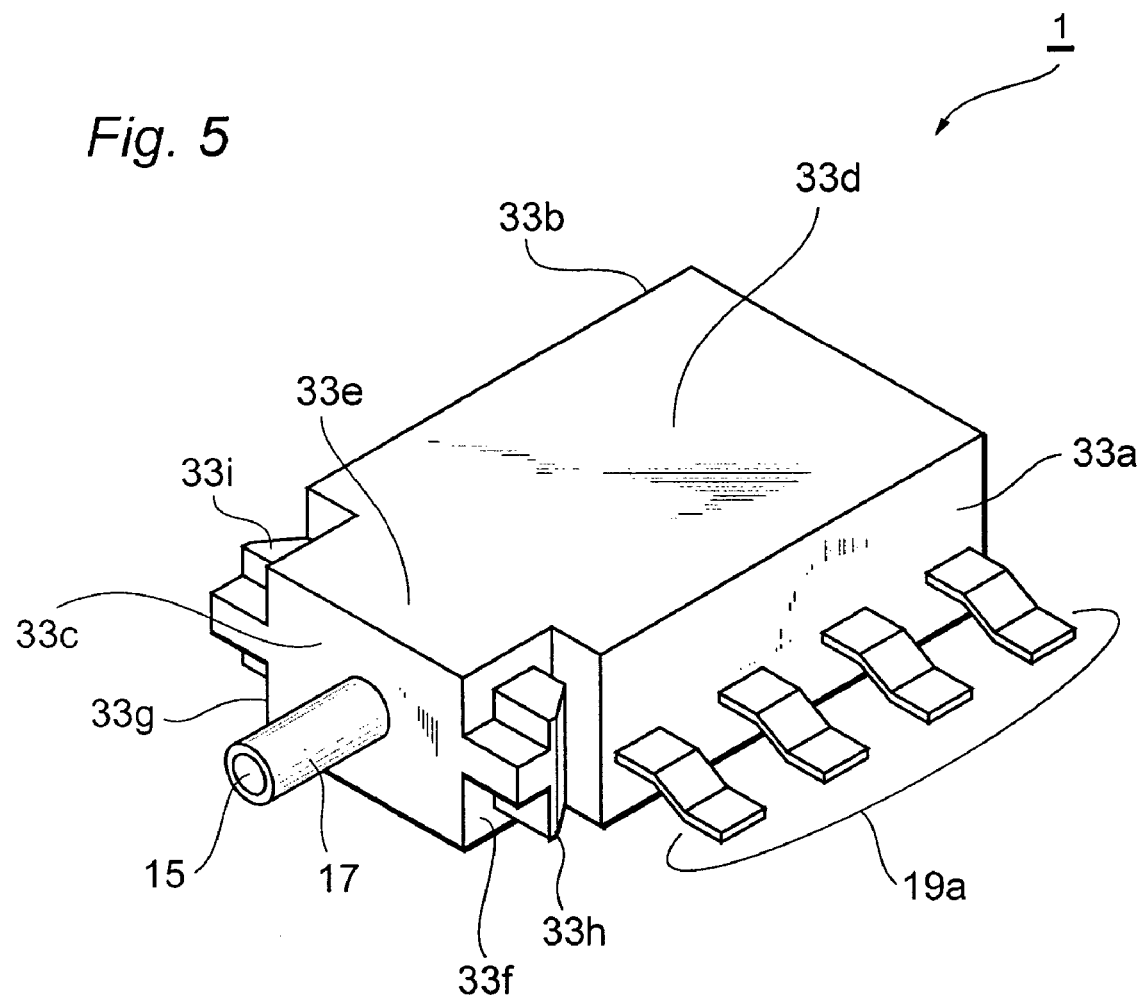
FIG. 5 shows an outward appearance of the optical module.

FIG. 5 is a perspective view showing the optical module after molding. The mold resin 33 has a body 33d and a head 33e, both side the head provide projections 33h, 33i mating to an optical connector thereto. One side 33a of the molding-resin 33 arranges the lead terminals 19a and another side 33b thereof arranges another lead terminals 19b, which is shown in FIG. 1. The front side 33c thereof extrudes the ferrule, the center of which exposes another tip of the optical fiber different to the tip optically coupling to the laser diode 9.

Next, the operation of the optical module 1 will be described as referring to FIG. 6.

Figure 6:
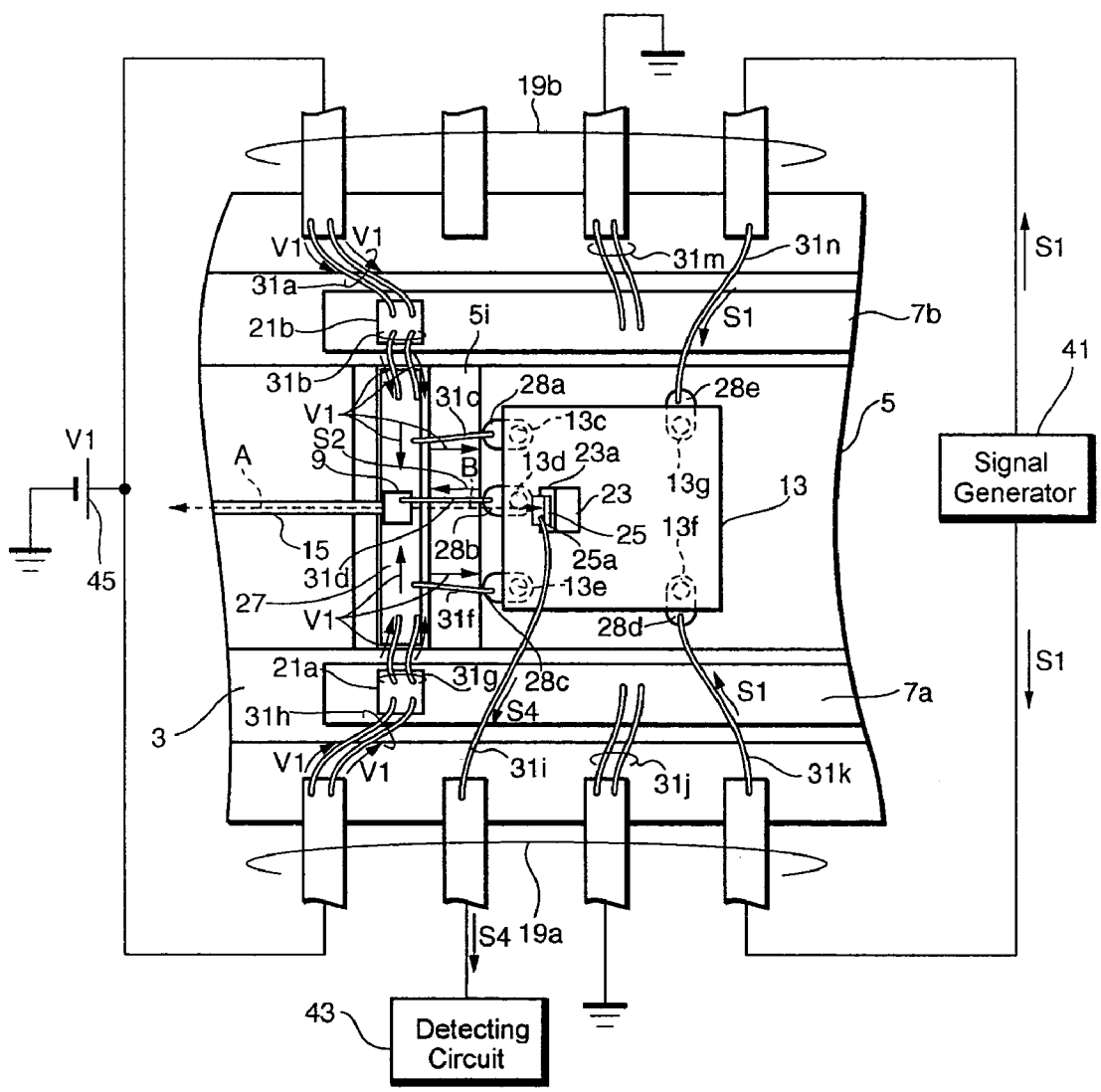
FIG. 6 is a schematic view showing the laser diode and its peripheral region.

As shown in FIG. 6, at least one lead terminal among terminals 19a and 19b is provided for ground terminals. It may be preferable to provide at least one ground terminal in terminals 19a and also at least one ground terminal in terminals 19b. Namely, the auxiliary member 7a is grounded by connecting to the lead terminal 19a through the bounding wire 31j, and the auxiliary member 7b is similarly grounded to lead terminal 19b thorough the bonding wire 31m.

The voltage V1 is provided to at least one terminal among the lead terminals 19a and also provided to at least one terminal among the lead terminals 19b from a power source 45. The voltage V1 supplied to the lead terminal 19a is provided to one electrode of the die-capacitor 21a through the bonding wire 31h. The other electrode of the die-capacitor 21a is directly connected to the auxiliary member 7a, thereby the voltage V1 is stabilized and is provided to the conductive wiring 27 on the second region 5q through the bonding wire 31g.

Similarly, the voltage V1 is supplied to the one electrode of the die-capacitor 21b through the bonding wire 31a. The other electrode of the die-capacitor is directly grounded to the auxiliary member 7b, thereby stabilizing the voltage V1. The voltage thus stabilized is provided to the wiring 27 through the bonding wire 31b.

Finally, thus stabilized and supplied voltage V1 is provided to the laser diode 9 and the driver 13. Namely the voltage V1 is provided to the anode terminal of the laser diode 9 through the conductive wiring, and is supplied to the driver through the conductive wiring 27, the bonding wires 31c, 31f, the wiring patterns 28a, 28c and the bump electrodes 13c, 13e of the driver.

An electrical signal S1, the optical signal to be transmitted is generated based thereon, is supplied from a signal generator 41 placed outside of the module thorough at least one terminal among the terminals 19a and also at least one terminal among the terminals 19b. The electrical signal S1 received at the terminal 19a is provided to the driver through the bonding wire 31k, the wiring pattern 28d and the bump electrode 13f. Similarly, the electrical signal S1 at the terminal 19b is also provided to the driver through the bonding wire 31n, the wiring pattern 28e and the bump electrode 13g.

The driver 13 thus provided the electrical signal S1 generates a signal S2 for driving the laser diode 9. The signal S2 is provided to the laser diode through the bump electrode 13d of the driver, the wiring pattern 28b and the bonding wire 31d.

The laser diode generates light in the active layer 94 thereof based on thus provided voltage V1 and the driving signal S2. The light is emitted from the light-emitting surface 9a of the laser diode 9 as the signal light "A" that enters the optical fiber 15, transmits within the fiber 15 and output therefrom to the outside of the module 1. Simultaneously, the monitored light "B" is emitted from the light-reflecting surface 9b of the laser diode 9 and enters the photodiode 25. The photodiode 25 generates a monitored signal S4 corresponding to the magnitude of the monitored light "B". The monitored signal S4 is output to at least one lead terminal 19a through the bonding wire 31i and finally transmitted to a detecting circuit 43. The detecting circuit is provided outside of the module in the present embodiment.

In a conventional optical module, the photodiode for monitoring the optical output of the laser diode is placed between the laser diode and the driver, as close as possible to the laser diode, to effectively detect the optical output thereof. This arrangement, on the other hand, makes it long the interval between the laser diode and the driver, which deteriorates the performance of the module.

In the present optical module 1, the laser diode is mounted on the second region 5q of the bench 5 and the driver is mounted on the first region 5r, and the level of the second region is lower than that of the second region. The monitored light "B" emitted from the light-reflecting surface 9b of the laser diode 9 can reach the photodiode 25 by passing the space above the driver. Consequently, the photodiode can effectively detect the monitored light without placing the photodiode between the laser diode and the driver. This means that the distance between the laser diode and the driver can be shorten, whereby the high frequency performance of the laser diode can be enhanced because the inductance depending on the length of the bonding wire connecting the laser diode to the driver can be decreased.

Another aspect of the present embodiment, the bench is configured so that the level of the upper surface of the driver is lower than that of the second region. This secures that the optical path above the driver, through which the monitored light "B" passes.

The driver having bump electrodes on the primary surface facing to the bench is mounted on the first region of the bench by flip-chip technique in this embodiment. This enables that the photodiode and chip carrier can be mounted on the upper surface of the driver, where any electric components such as electrodes for the wiring are not provided. Consequently, the photodiode can be placed adjacent to the laser diode, which results in an effective detecting of the monitored light.

(Second Embodiment)

Figure 7:
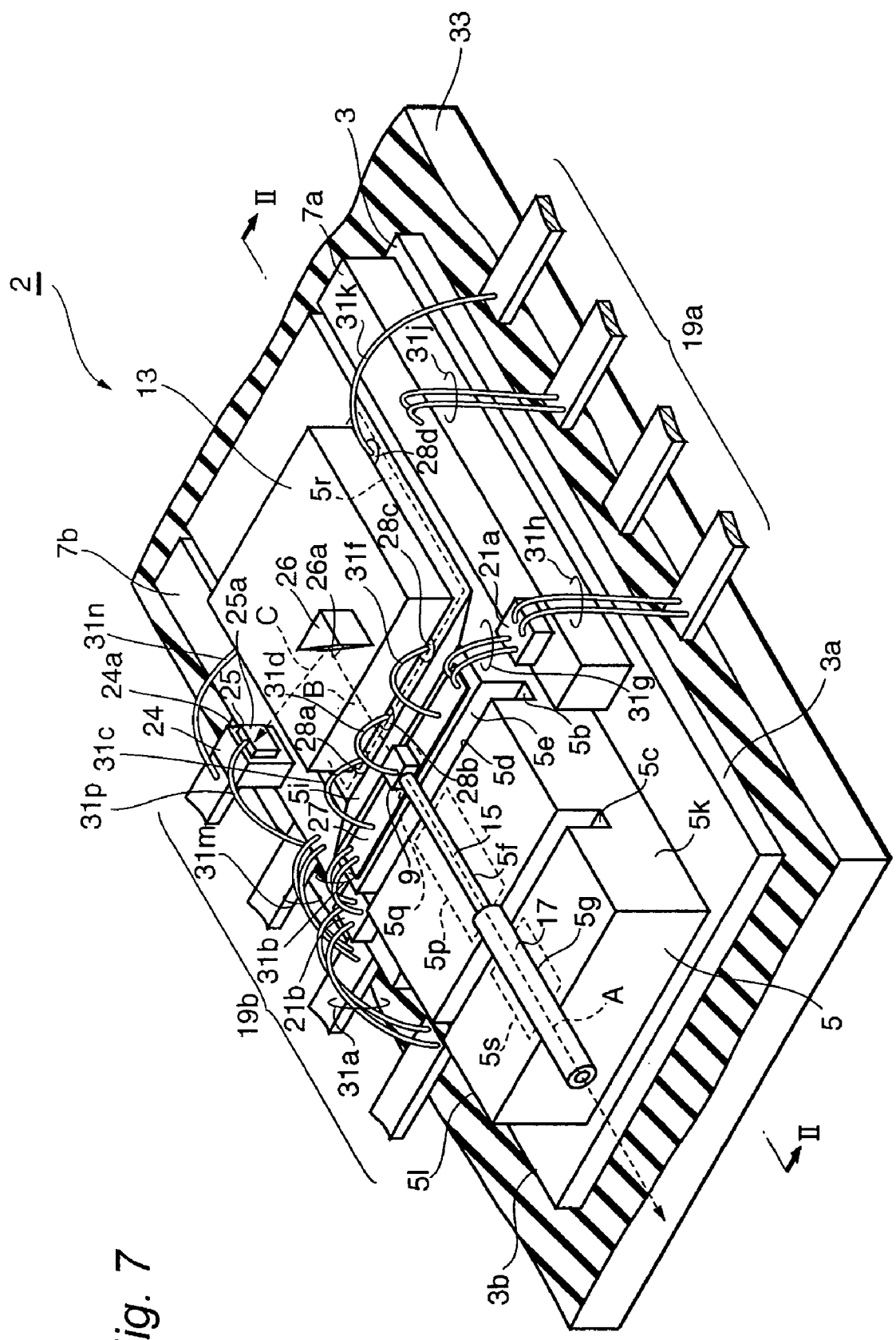
FIG. 7 is a perspective view showing another embodiment of the invention.
Figure 8:
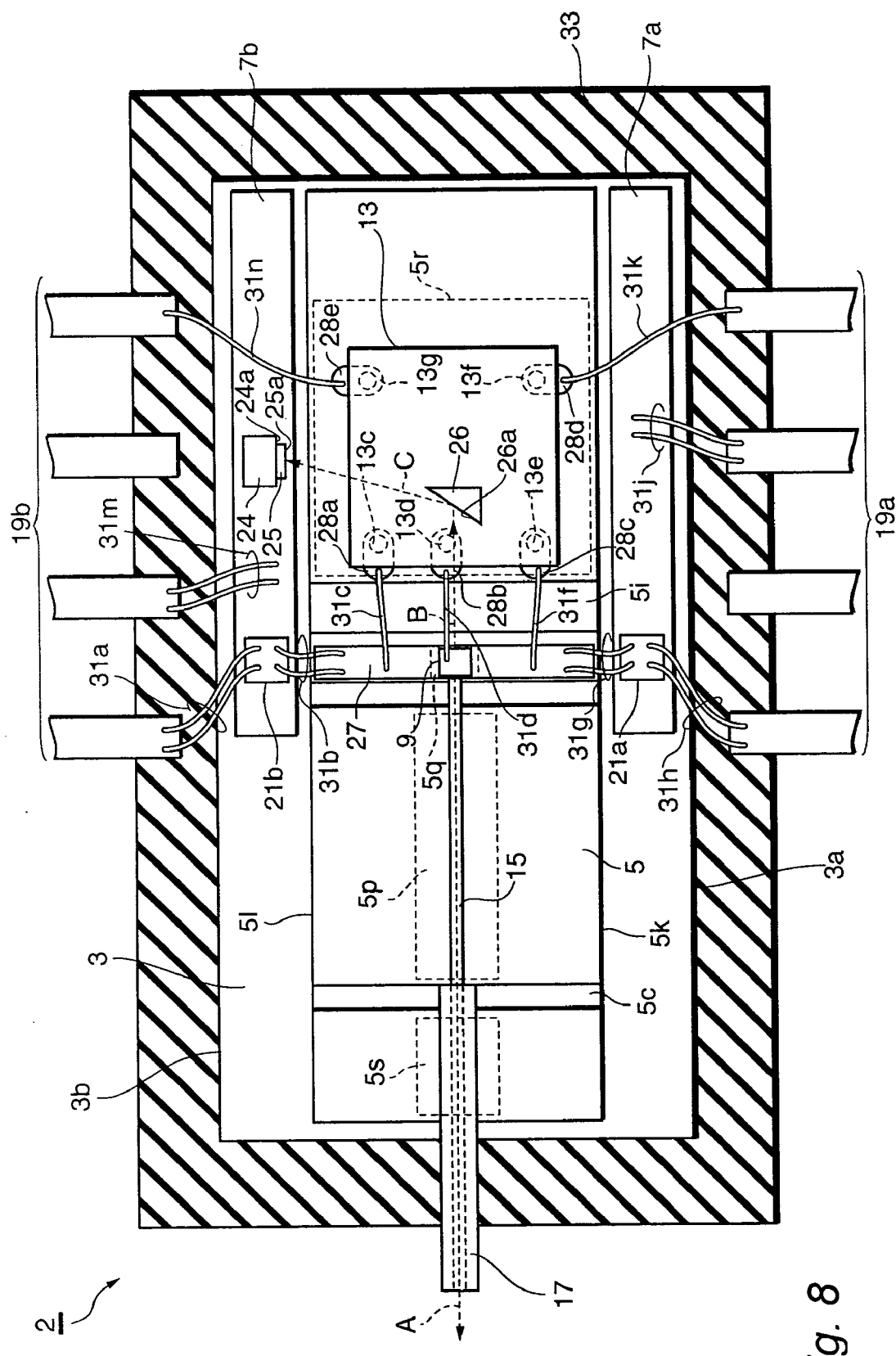
FIG. 8 is a plan view of the optical module shown in FIG. 7.
Figure 9:
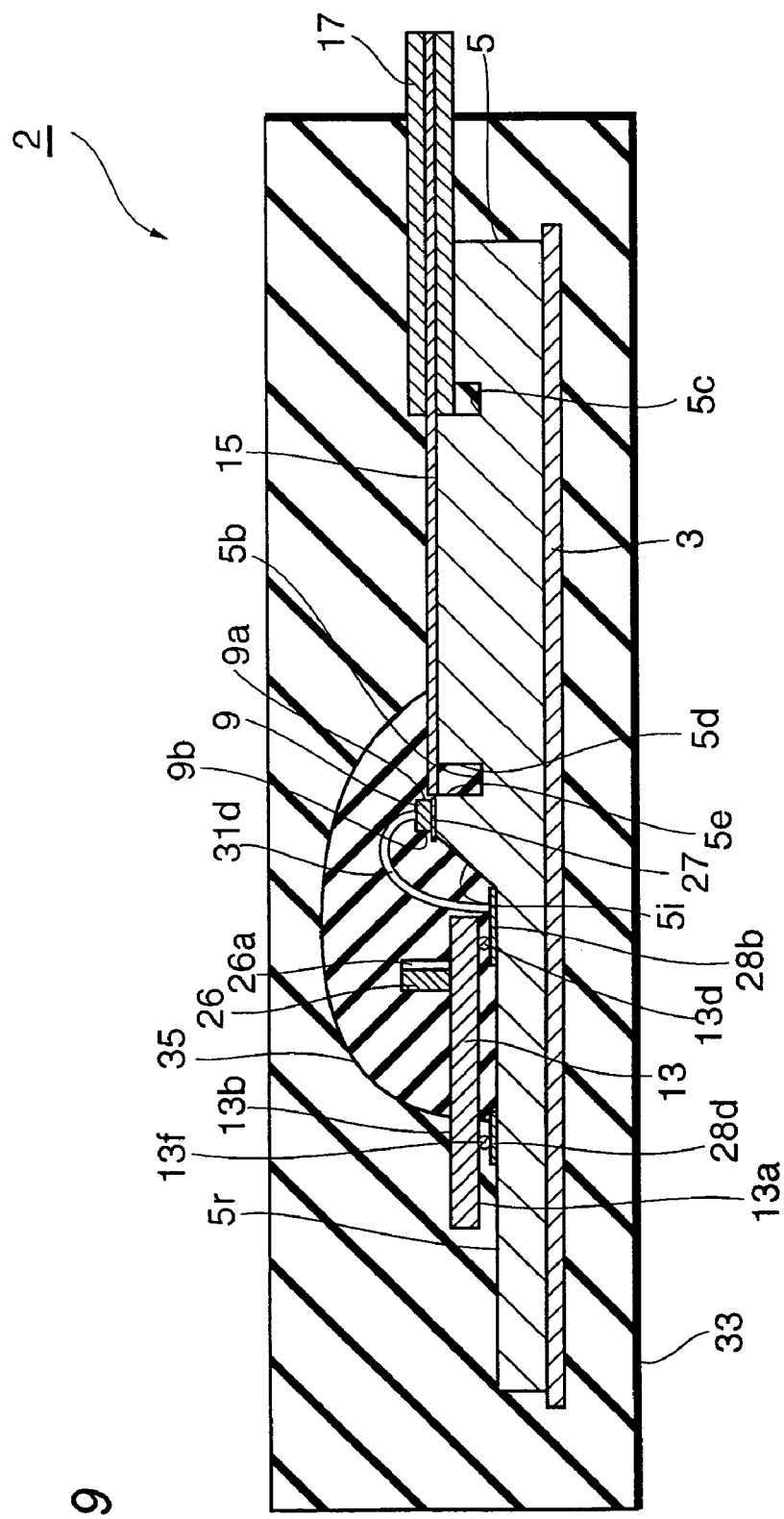
FIG. 9 is a cross sectional view taken along II—II in FIG. 7.
Figure 10:
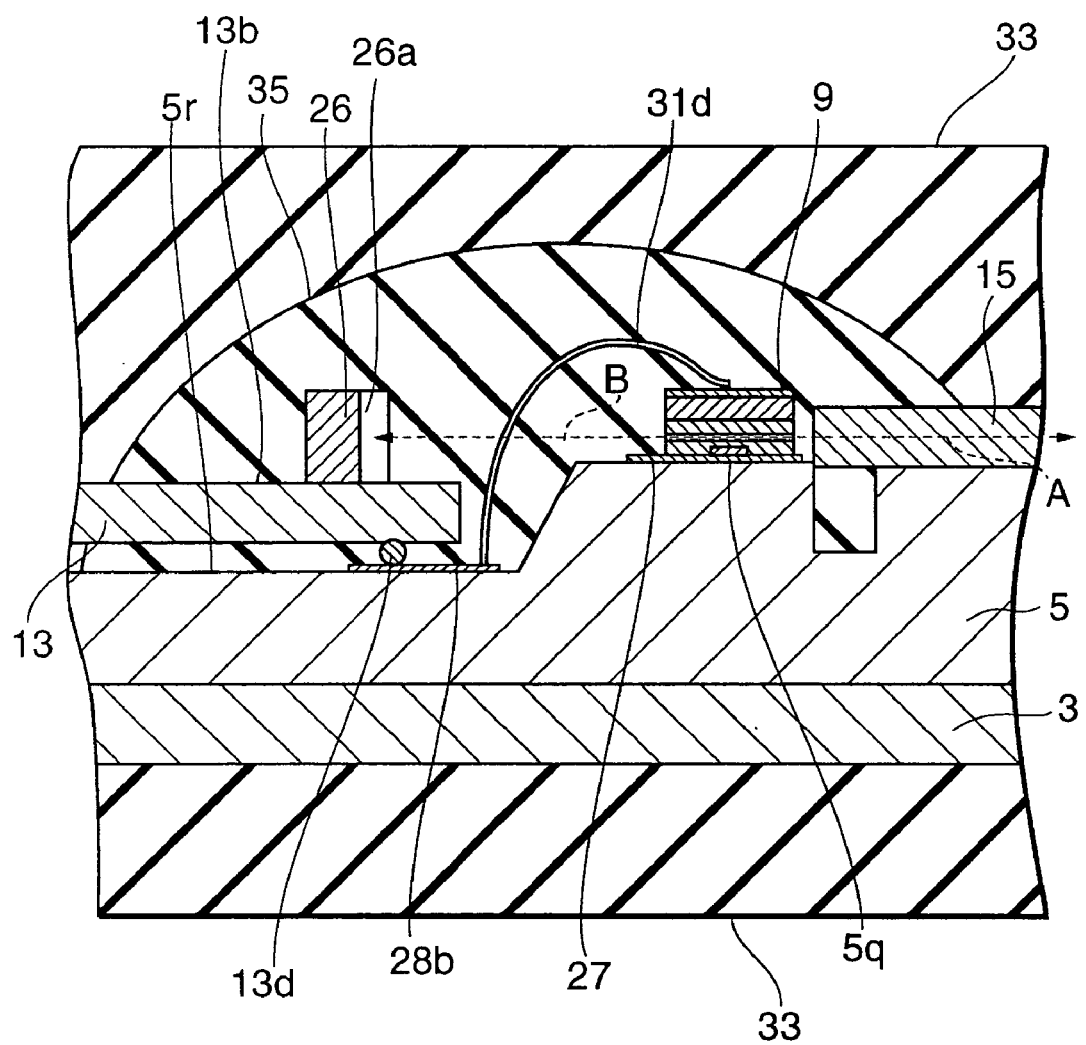
FIG. 10 shows a magnified view around the laser diode in FIG. 9.

Next, the second embodiment of the present invention will be described. FIG. 7 shows a perspective view of the second embodiment, FIG. 8 is a plan view of the optical module 2 shown in FIG. 7, FIG. 9 is a cross sectional view of the optical module 2 taken along II—II in FIG. 7 and FIG. 10 magnifies the region around the laser diode 9 in FIG. 9.

The optical module 2 comprises a substrate 3, a bench 5, auxiliary members 7a and 7b, a laser diode 9, a driver 13, an optical fiber 15, a ferrule 17, a chip carrier 24, a photodiode 25 and a optical device 26. Among the parts shown in figures, those parts except the chip carrier 24, the photodiode and the optical device are same as those described in the first embodiment.

The optical device 26, which may be made of a metal block and a glass prism, configures nearly triangular prism and one side thereof is a reflective surface 26a. The optical device 26 is mounted on the upper surface 13b of the driver 13 so that the reflective surface 26a crosses the predetermined axis. The reflective surface 26a couples the light-reflecting surface 9b of the laser diode 9 to the light-receiving surface 26a of the photodiode 26. Namely, the monitored light "B" emitted from the light-reflecting surface 9b of the laser diode 9 is received by the reflective surface 26a and reflects the reflected light "C" to the photodiode 25.

The chip carrier 24 having a surface 24a for mounting the photodiode is provided on one of the auxiliary member 7b. The shape of the chip carrier is nearly quadratic prism, one side of which forms the mounting surface 24a. The photodiode 25 with the chip carrier 24 is aligned so that the reflected light "C" from the optical device effectively enters the light-receiving surface 25a of the photodiode 25, whereby the light-receiving surface 25a can optically couples to the light-reflecting surface 9b of the laser diode 9 through the reflective surface 26a of the optical device 26. The photodiode 25 is connected to the lead terminal 19b by the bonding wire 31p.

The optical module 2 is molded with a resin 33, a primary portion of which is encapsulated by a transparent resin 35. The outward appearance of the module 2 and the operation thereof are same as those of the optical module 1 according to the first embodiment shown in FIG. 5.

In the optical module 2, similar to the first embodiment, the level of the second region of the bench where the laser diode is mounted is higher than the first region where the driver is mounted. Consequently, the monitored light from the laser diode effectively reaches the photodiode by passing the space above the driver, which enables the driver to place closely to the laser diode and to enhance the high frequency performance of the laser diode.

In the second embodiment, the driver is mounted by the flip-chip technique, where the primary surface thereof having bump electrodes faces to the first region of the bench, whereby the optical device can be mounted onto the upper surface thereof.

(Third Embodiment)

Figure 11:
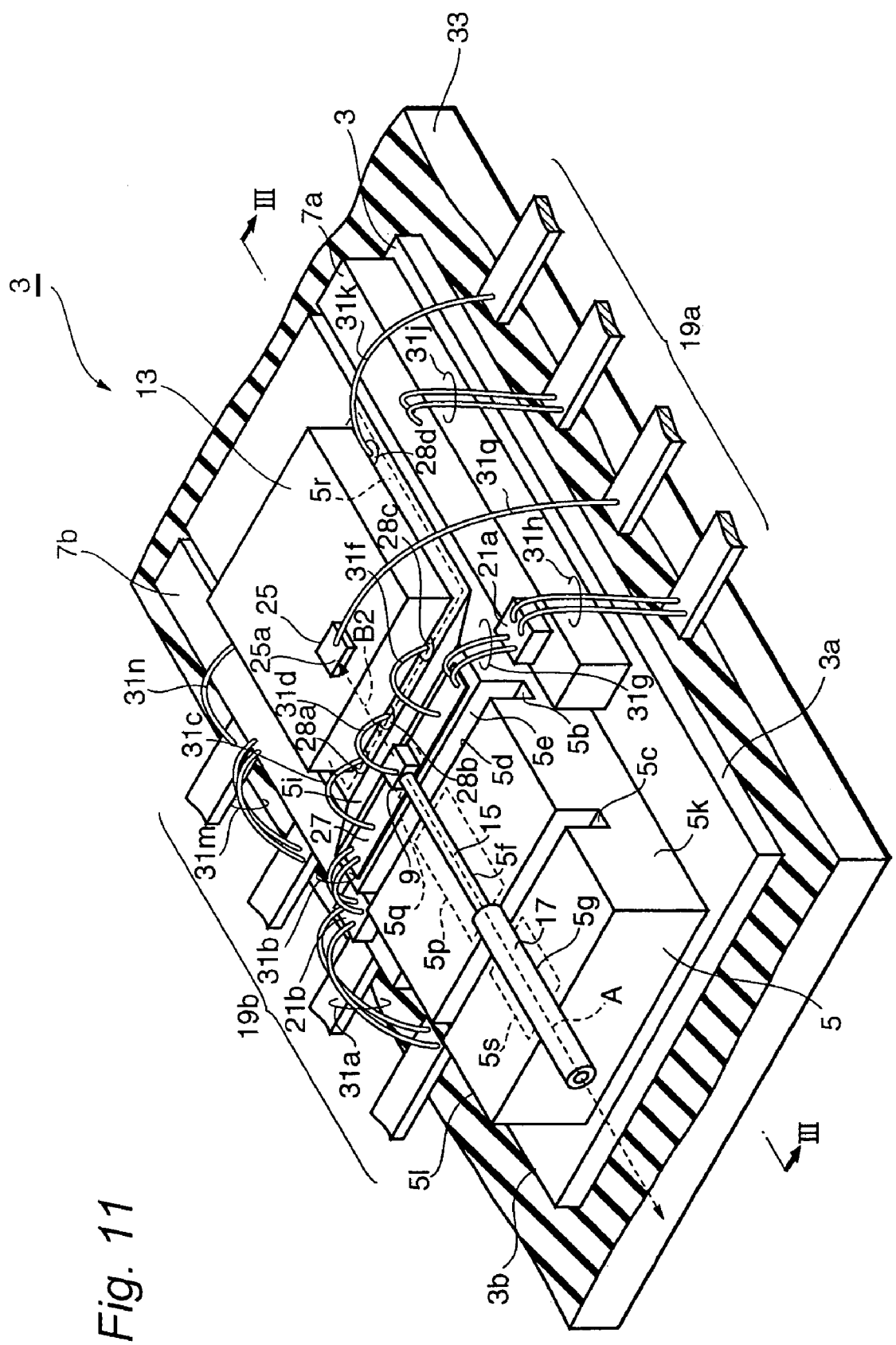
FIG. 11 is a perspective view of the third embodiment of the present invention.
Figure 12:
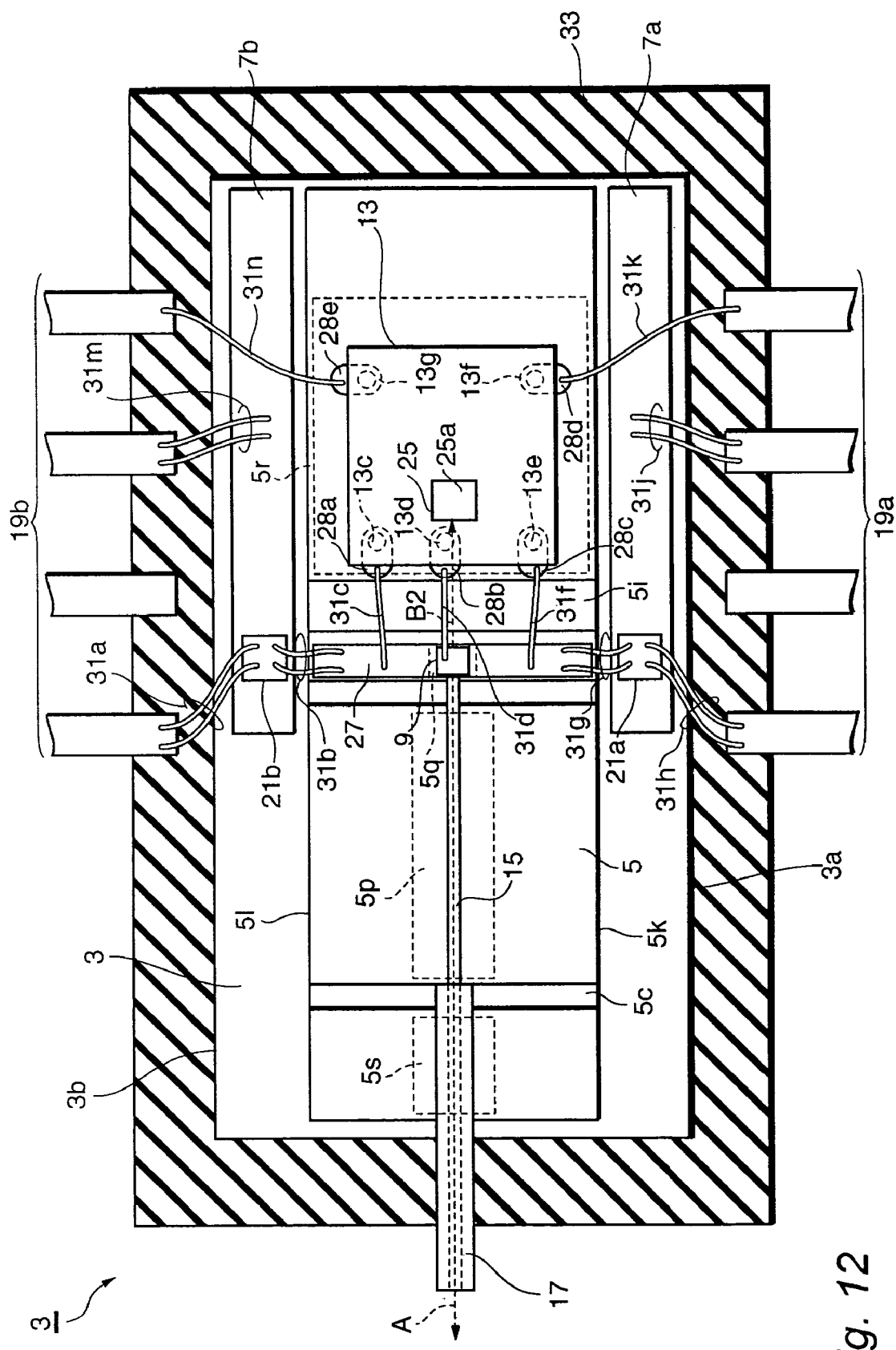
FIG. 12 is a plan view of the optical module shown in FIG. 11.
Figure 13:
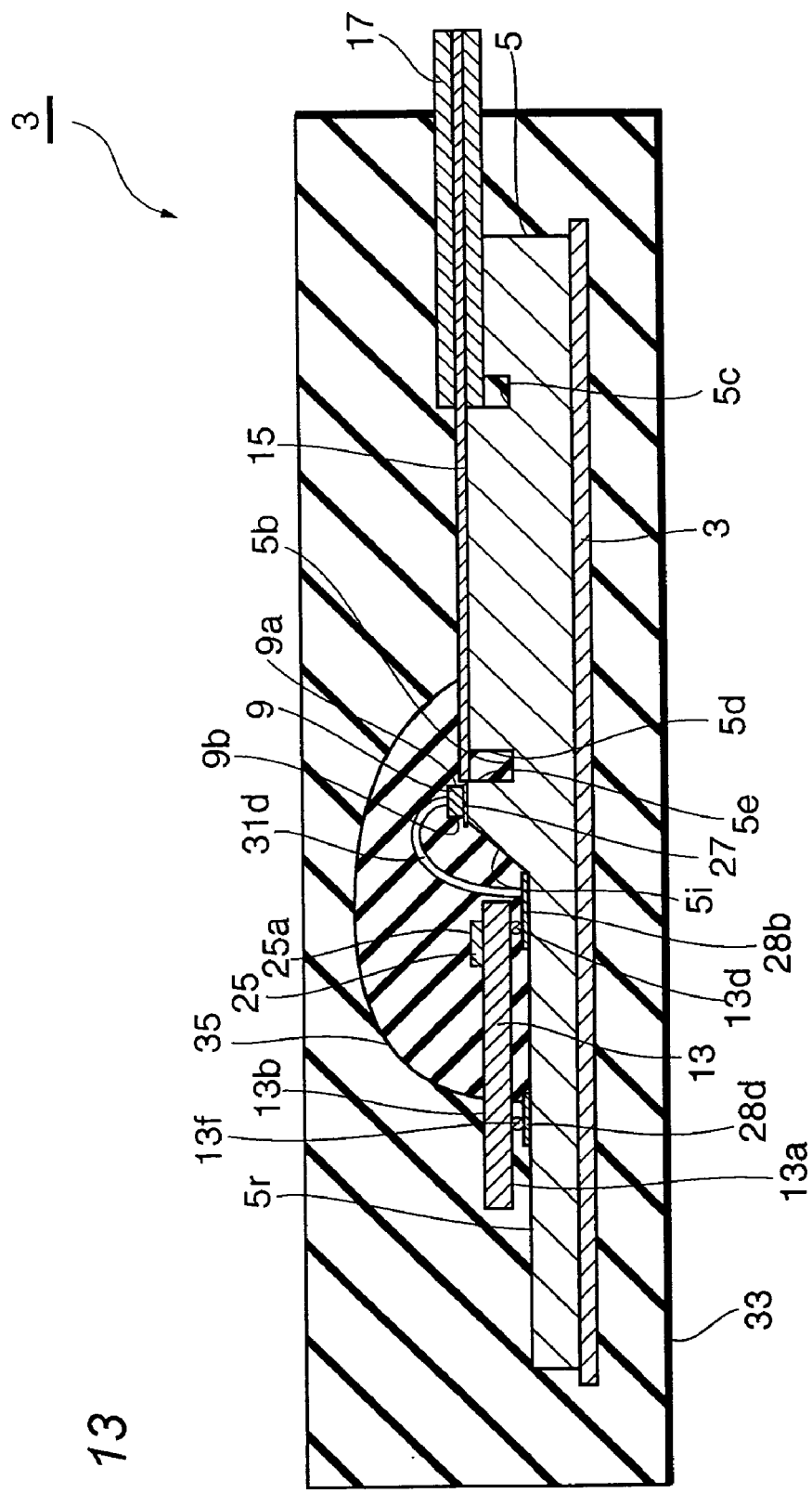
FIG. 13 is a cross sectional view taken along III—III in FIG. 11.
Figure 14:
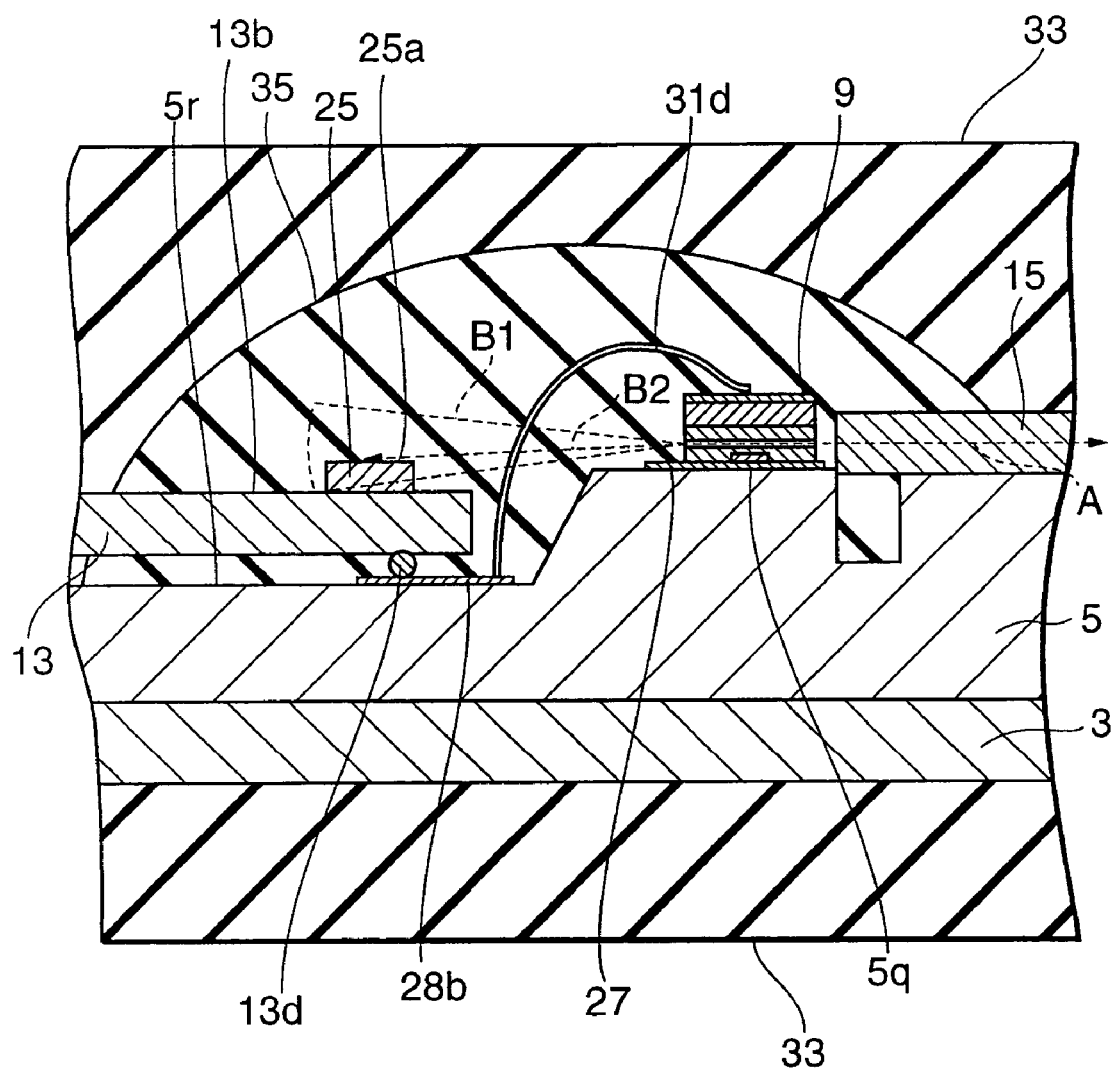
FIG. 14 shows a magnified view around the laser diode in FIG. 13.

FIG. 11 shows a third embodiment of the present invention, FIG. 12 is a plan view of the optical module 3 shown in FIG. 11, FIG. 13 is a cross sectional view taken along III—III in FIG. 11, and FIG. 14 magnifies a portion of FIG. 13.

The optical module 3 according to the third embodiment comprises a substrate 3, a bench 5, auxiliary members 7a and 7b, a laser diode 9, a driver 13, an optical fiber 15, a ferrule 17, a photodiode 25, lead terminals 19a and 19b, and die-capacitors 21a and 21b. These components except the photodiode are same as those of the optical module 1 of the first embodiment.

In the third embodiment, the photodiode 25 is mounted onto the driver 13 so that a surface opposing to the light-receiving surface 25a faces to the upper surface of the driver 13. The photodiode 25 receives a portion "B2" of the monitored light "B1" emitted from the light-reflecting surface 9b of the laser diode 9, as shown in FIG. 14. Therefore, the level of the light receiving surface 25a is lower than that of the second region 5q where the laser diode 9 is mounted. Furthermore, the photodiode is aligned so that the light-receiving surface 25a thereof can detect the monitored light "B" from the laser diode 9, whereby the light-receiving surface 25a is optically coupled to the light-reflecting surface 9b of the laser diode 9. One electrode of the photodiode 25 is connected to the lead terminal 19a through the bonding wire 31g as shown in FIG. 11.

The optical module 3 is also molded by the resin 33 as a primary portion, where the optically coupling device such as the laser diode 9, the photodiode 25 and the optical fiber, is encapsulated with the transparent resin 35. The outward appearance and the operation thereof are also same as those described for the optical module 1 of the first embodiment.

Figure 15:
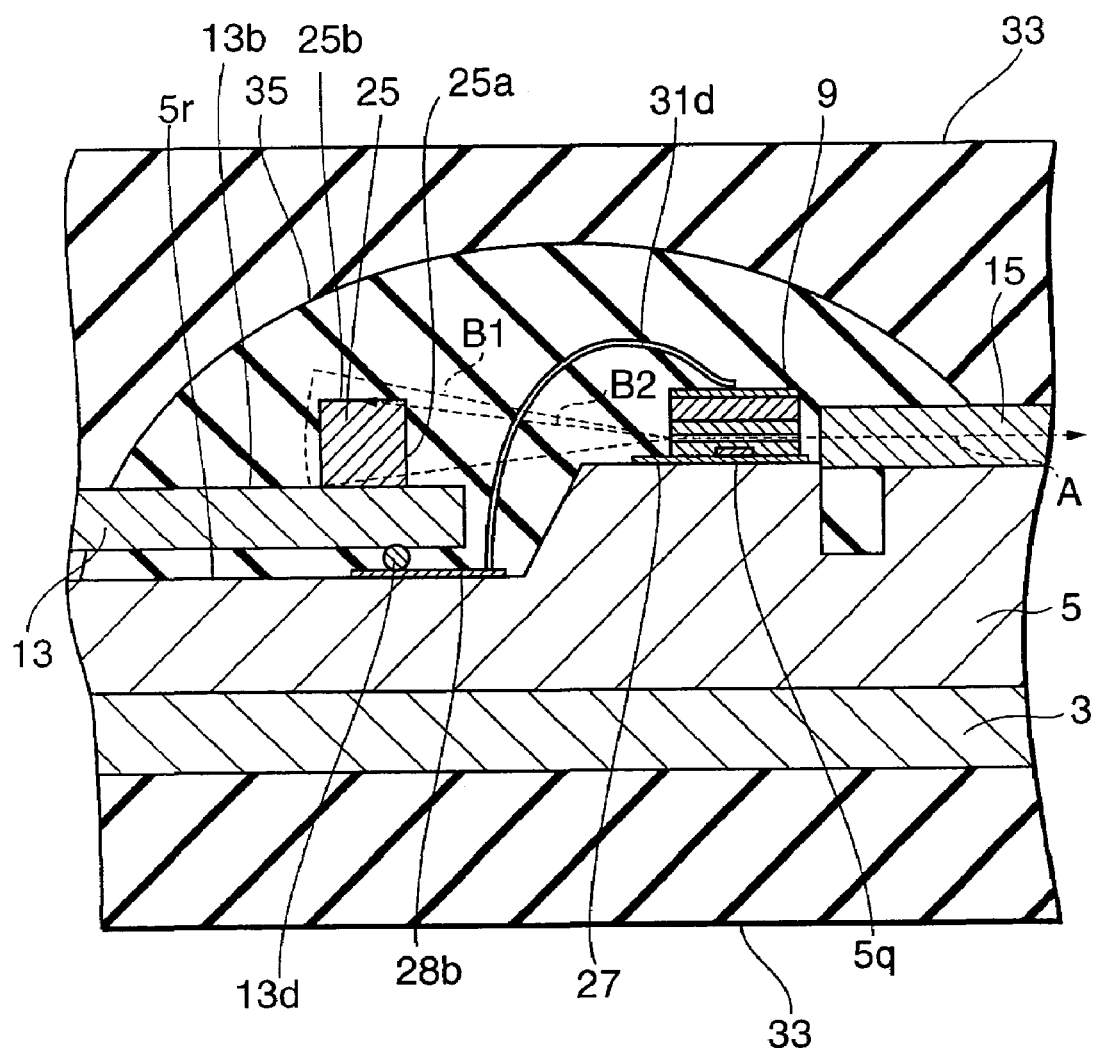
FIG. 15 is a cross sectional view showing a modified configuration of the optical module.

FIG. 15 is a side view showing a modified arrangement of the optical module 3 of the third embodiment. In FIG. 15, the side 25a of the photodiode 25 configures the light-receiving surface and the upper surface thereof 25b is configured to be a light sensitive. The monitored light "B" with some spreading emitted from the laser diode 9 enters from the light-receiving surface 25a of the photodiode 25 and detected at the light sensitive surface 25b. In this embodiment, the level of the light sensitive surface 25b of the photodiode 25 is higher than that of the active layer 94 of the laser diode 9, whereby the surface 25b optically couples to the light-reflecting surface 9b of the laser diode 9.

In the optical module of the third embodiment, the level of the second region of the bench where the laser diode is mounted thereon is higher than that of the first region where the driver is mounted. The monitored light emitted from the laser diode can pass the space above the driver and, consequently can be effectively detected by the photodiode. Therefore, the driver can be placed next to the laser diode without placing the photodiode between the laser diode and the driver, thereby the high frequency performance of the laser diode.

Moreover, the driver is mounted by the flip-chip technique, where the primary surface thereof with bump electrodes faces to the first region of the bench, whereby the optical device can be directly mounted onto the upper surface thereof. The photodiode may be placed adjacent to the laser diode to effectively detect the monitored light from the laser diode. Moreover, in the third embodiment, since the photodiode is mounted directly on the driver without the chip carrier, the simple configuration can be realized.

The optical module according to the present invention is not restricted to those exemplary illustrated embodiments. Although the first region of the bench reaches to edges and is in contact with sides 5l and 5k thereof, the first region may be a hollow so that the level of the peripheral is higher than the bottom thereof and the driver is mounted on the bottom. Furthermore, although the light-emitting surface 9a of the laser diode is directly couples to the tip of the optical fiber in the embodiment, another optical device such as a lens may be interposed therebetween. Such variations are not to be regarded as a departure from the spirit and scope of the invention, and all such modifications as would be obvious to one skilled in the art are intended for inclusion within the scope of the following claims.

What is claimed is:

1. An optical module, comprising:
    a bench having a first region and a second region;
    a light-emitting semiconductor device mounted on the second region of the bench for emitting light, the light-emitting semiconductor device having a first surface and a second surface;
    a driver electrically connected to the light-emitting device for driving the light-emitting semiconductor device and mounted on the first region of the bench, the driver having a top surface and a bottom surface opposite to the top surface, the bottom surface facing the bench;
    a light-receiving semiconductor device for receiving light emitted from the second surface of the light-emitting semiconductor device, the light passing a space spreading above the top surface of the driver; and
    a substrate for installing the bench thereon,
    wherein a level of the first region of the bench measured from the substrate is lower than a level of the second region of the bench measured from the substrate.

2. The optical module according to claim 1, wherein the level of the second region of the bench is higher than a level of the top surface of the driver.

3. The optical module according to claim 1, wherein a plurality of electrodes of the driver is provided in the bottom surface of the driver and the driver is mounted on the first region of the bench by a flip-chip technique.

4. The optical module according to claim 3, wherein the optical module further comprises a chip carrier mounted on the top surface of the driver, the light-receiving semiconductor device being mounted on the chip carrier.

5. The optical module according to claim 3, wherein the optical module further comprises an optical device having a light-reflecting surface, the optical device being mounted on the secondary surface of the driver, the light-receiving semiconductor device being optically coupled to the second surface of the light-emitting semiconductor device through the light-reflecting surface of the optical device.

6. The optical module according to claim 3, wherein the light-receiving semiconductor device has a light-incident surface and a light-sensitive surface, the light-incident surface begin inactive to the light emitted from the light-emitting semiconductor device and facing the second surface of the light-emitting semiconductor device and the light-sensitive surface intersecting the light-incident surface.

7. The optical module according to claim 6, wherein the light-receiving semiconductor device is mounted on the top surface of the driver in a configuration that the light-sensitive surface faces the top surface of the driver.

8. The optical module according to claim 1, further comprising an optical fiber having a tip facing the light-emitting semiconductor device for receiving the light emitted from the first surface of the light-emitting semiconductor device.

9. The optical module according to claim 8, wherein the bench further comprises a third region, the regions from the first to the third being arranged along a predetermined direction, the third region having a first groove parallel to the predetermined direction for receiving the optical fiber therein.

10. The optical module according to claim 9, wherein the bench further comprises a second groove between the second region and the third region, the second groove intersecting the predetermined direction and the first groove reaching the second groove, and
    wherein the second groove has a side, the optical fiber being aligned to the light-emitting semiconductor device mounted in the second region of the bench by abutting the tip of the optical fiber against the side of the second groove.

11. The optical module according to claim 8,
    wherein the light-emitting semiconductor device, the light-receiving semiconductor device, and the tip of the optical fiber are encapsulated by a resin transparent to the light emitted from the light-emitting semiconductor device.

12. The optical module according to claim 1,
    wherein the bench is made of an insulator.

13. The optical module according to the claim 1,
    wherein the bench is made of silicon.

* * * * *